United States Patent [19]

Tsuchiya et al.

[11] Patent Number: 5,128,950
[45] Date of Patent: Jul. 7, 1992

[54] LOW NOISE PULSED LIGHT SOURCE USING LASER DIODE

[75] Inventors: Yutaka Tsuchiya; Hironori Takahashi; Takuya Nakamura, all of Hamamatsu, Japan

[73] Assignee: Hamamatsu Photonics K.K., Shizuoka, Japan

[21] Appl. No.: 560,773

[22] Filed: Jul. 31, 1990

[30] Foreign Application Priority Data

Aug. 2, 1989 [JP] Japan .................. 1-201104

[51] Int. Cl.⁵ .............................. H01S 3/10
[52] U.S. Cl. ........................ 372/25; 372/26; 372/29; 372/30; 372/31; 372/38; 359/180; 359/181.
[58] Field of Search ............. 372/12, 21, 25, 26, 372/29, 31, 38, 30; 455/609, 611

[56] References Cited

U.S. PATENT DOCUMENTS

| | | | |
|---|---|---|---|
| 4,450,564 | 5/1984 | Meuleman et al. | 372/26 |
| 4,611,352 | 9/1986 | Fujito et al. | 455/609 |
| 4,689,795 | 8/1987 | Yoshimoto et al. | 372/31 |
| 4,698,817 | 10/1987 | Burley | 372/31 |
| 4,799,069 | 1/1989 | Sasaki et al. | 346/108 |
| 4,813,048 | 3/1989 | Yamane et al. | 372/38 |
| 4,819,242 | 4/1989 | Kaku et al. | 372/38 |
| 4,884,280 | 11/1989 | Kinoshita | 372/38 |
| 4,945,541 | 7/1990 | Nakayama | 372/31 |

FOREIGN PATENT DOCUMENTS

| | | |
|---|---|---|
| 0218449 | 4/1987 | European Pat. Off. |
| 0221710 | 5/1987 | European Pat. Off. |
| 0229432 | 1/1989 | European Pat. Off. |

OTHER PUBLICATIONS

Stable Ultrashort Laser Diode Pulse Generator, Y. Tsuchiya, A. Takeshima, M. Hosoda, Rev. Sci. Instrum. 52(4), Apr. 1981, 1981 American Institute of Physics.

IEEE Journal of Quantum Electronics, vol. QE-17, No. 5, May 1981, Picosecond Pulse Generation from InGaAsP Lasers at 1.25 and 1.3 um by Electrical Pulse Pumping, Pao-Lo Liu, Chinlon Lin, I. P. Kaminlow, J. J. Hsieh.

IEEE Journal of Quantum Electronics, vol. QE-22, No. 1, Jan. 1986, Subpicosecond Electrooptic Sampling: Principles and Applications, Janis A. Valdmanis, G. Mourou.

Application of Picosecond Light Pulses Generated from an AlGaInP Visible Diode Laser for Photoluminescence Decay Measurement of GaAs/AlGaAs Quantum Wells, H. Yokoyama, H. Iwata, K. Onabe, T. Suzuki, Rev. Sci. Instrum. 59 (4), Apr. 1988, 1988 American Institute of Physics.

Primary Examiner—Georgia Y. Epps
Attorney, Agent, or Firm—Oliff & Berridge

[57] ABSTRACT

A low noise pulsed light source using a laser diode for generating a short pulsed light of a high repetitive frequency. The low noise pulsed light source includes a laser diode driven by an electric pulse generator for emitting repetitive pulsed light; a current source for supplying a bias current to the laser diode; and a photodetector for detecting the repetitive pulsed light emitted from the laser diode; and control means. The control means modulates at least one of the bias current from the current source and the amplitude of a pulse signal generated from the electric pulse generator in accordance with an output signal from the photodetector such that the intensity of the pulsed light is kept unchanged and any noise involved in the same is reduced.

9 Claims, 12 Drawing Sheets

LOW NOISE PULSED LIGHT SOURCE USING LASER DIODE

BACKGROUND OF THE INVENTION

1. Field of the Invention

The present invention relates to a pulsed light source using a laser diode for generating a short pulsed light (200 to 2 picosecond pulse width, for example) of a high repetitive frequency, and more specifically to a low noise pulsed light source capable of generating an optical pulse with reduced light intensity noise.

2. Description of the Prior Art

An emitted light from a laser diode (LD) changes in its wavelength and intensity as an excitation current and ambient temperature vary. The intensity of the emitted light also changes owing to the competition among longitudinal modes and owing to mode hopping. As a method for reducing such variations of the light intensity, there is known a technique wherein a photodetector element such as a photodiode (PD) detects part of the emitted light from a laser diode to estimate an error signal between a detected light intensity level and a preset one which error signal is in turn fed back to an excitation current source which is to drive the laser diode. Such a technique has already been used for an optical pick-up of a compact disk (CD) player and so on.

However, all prior practice to reduce the variations of the light intensity was applied to a laser diode for emitting continuous wave (CW) light or direct current (DC) light. Up to now, no investigation was made of the noise in the intensity of such pulsed light, and no trial was made to stabilize the pulsed light intensity.

On the other hand, there are many application fields in need of short pulsed light because of temporal resolution being specified by the width of pulsed light. Those fields include an electro optic sampling technique as disclosed in IEEE Journal of Quantum Electronics, Vol. QE-22, No. 1, January 1986, PP 69 through 78 in which an ultrashort light pulse is used as a sampling gate to nondestructively measure an electric signal with use of an electro-optic (E - O) effect; a fluorescence life measuring technique as disclosed in Rev. Sci. Instrum. 59 (4), Apr. 1988, PP 663 through 665 in which an ultrashort light pulse is used to measure laser excited fluorescence; estimation of response characteristics of photoelectric detectors and optical intergrated circuits (OE IC), etc.; time correlated photon counting method using a photomultiplier, and so on, for example. A dye laser which generates a picosecond to femtosecond width pulsed light is usable for such applications from the viewpoint of time resolution but with a difficulty of its being large-sized. Instead of this, laser diodes are hopeful as pulsed light sources, because they have some advantages of their being simple and small-sized in structure, inexpensive in manufacture.

Now, laser diodes can generate a short pulsed light with an about 200 to 20 picosecond width, and with about 670 nm to 1.5 μm wavelengths being typical, the latter emission wavelengths being varied depending upon the kinds thereof. Additionally, a second harmonic of the pulsed light from a laser diode is available to assure a short wavelength pulsed light up to 340 nm. Repetitive frequencies of such light pulses generally range from 0.1 to 200 MHz although being different in accordance with applications. Furthermore, there are technically available GHz high repetition pulsed light.

The present inventors have however experimentally found that use of such a high repetition optical pulse causes measured intensity fluctuations of the light pulse so as to limit the accuracy of a pulse light intensity measurement described below particularly with respect to FIG. 12. For simplicity, there will be described a measurement of transmittance of a pulsed light through a sample 10 with use of a device illustrated in FIG. 10. In FIG. 10, a laser diode 12A (refer to FIG. 11) incorporated in a laser diode (LD) pulsed light source 12 emits the optical pulse which is controlled in its repetitive frequency by an oscillator 14 (repetitive frequency 100 MHz, pulse width 50 picosecond, and wavelength 830 nm, for example). The LD pulsed light source 12 is constructed as illustrated in FIG. 11, for example, to which a bias current has previously been supplied and on which a negative pulse is applied from an electric pulse generator 12B (Hewlett Packard, 33002A Comb-Generator (registered trademark) for example) using a step recovery diode for example to drive the LD 12A.

The pulsed light emitted from the laser diode (LD) 12A impinges upon the sample 10 through a chopper 16 (chopping frequency 1 kHz, for example) driven by the oscillator 15 and is partly absorbed by and partly transmitted through the same as an output light. The output light is focused by a lens 18 and detected by a photodetector 20 composed of a photodiode (PD) for example. An output signal from the photodetector 20 is amplified by a low noise amplifier 22 and lock-in detected by a lock-in amplifier 24. A chopper signal generated by the oscillator 15 is used for a reference signal in the lock-in amplifier 24. Herein, photoelectric current noises produced in the photodetector 20 and noises produced in the low noise amplifier 22 have been reduced by limiting noise passing through lock-in amplifier 24 to noise having a frequency within a predetermined frequency range defined by the bandpass of lock-in amplifier 24.

An output from the lock-in amplifier 24 is fed to an output meter 26 for example and displayed with respect to the transmittance of the foregoing output light.

Herein, although the foregoing device of FIG. 10 was made of the chopper 16 and of the lock-in amplifier 24 for lock-in detection for the purpose of the reduction of measurement noises and the improvement of measurement accuracy, such construction is unnecessary in simple measurements. In other words, an output from the photodetector 20 may be amplified and read in a direct manner. Further, the low noise amplifier 22 may be omitted and the lock-in amplifier 24 may instead be employed.

In such a device, in a case where the transmittance of the pulsed light through the sample 10 is nonlinear with respect to the incident pulsed light intensity, and when it is required that the incident pulsed light intensity be accurately measured, it is required that pulse light intensity be measured with a sufficiently low level of the intensity fluctuation so that a desired measurement accuracy is achieved. Thereupon, a difficulty was discovered in the measurement process, the difficulty being that photoelectric current noise involved in the pulsed light emitted from a pulsed oscillation LD limits the sensitivity of the measurement.

Referring to FIG. 12, exemplary noise characteristics of the LD pulsed light obtained experimentally by the present inventors are illustrated, with the horizontal axis being frequencies and the vertical axis being effective values (rms) of photoelectric current noise in decibel (dB). The point O dB on the vertical axis indicates a shot noise level defined by the square root of the number of photons involved in the optical pulse (theoretical limit). FIG. 12 therefore indicates a noise level of the LD pulsed light normalized by the shot noise level. FIG. 12 further illustrates a noise level with the prior system as indicated by a solid line A and marks X. It is understood from the figure that the noise level when the LD undergoes pulsed oscillation is at least 10 times greater (20 dB) than the shot noise level, so that it is desired that the former be reduced to the latter shot noise level.

The data illustrated in FIG. 12 is given by measuring photoelectric current noise produced when the LD 12A is driven by a driving circuit 30 constructed as illustrated in FIG. 11 using a noise fraction measuring device composed of the photodetector 20, low noise amplifier 22, lock-in amplifier 24, an oscillator (OSC) 32 for frequency sweep, a noise detection circuit 34, and a display 36 as shown in FIG. 13.

SUMMARY OF THE INVENTION

In view of the drawbacks with the prior art, it is an object of the present invention to provide a low noise pulsed light source using a laser diode capable of assuring high repetition pulsed light with very stable intensity and with reduced light intensity noise.

To achieve the above object, a low noise pulsed light source using a laser diode according to the present invention comprises a laser diode for emitting repetitive pulsed light; an electric pulse generator for driving said laser diode; a current source for supplying a bias current to said laser diode; a photodetector for detecting the repetitive pulsed light emitted from said laser diode; and a control means for modulating at least one of the bias current of the current source and the amplitude of a pulsed signal generated from said electric pulse generator in accordance with an output signal from said photodetector such that the intensity of said pulsed light remains unchanged and light intensity noise is reduced.

Further, in the same pulsed light source, said control means is a stabilized current modulator circuit that modulates the bias current from the current sources in accordance with an output from the photodetector, and the stabilized current modulator circuit comprises, a light intensity signal comparator circuit for comparing the output from the photodetector and a level signal, and making a signal representative of DC component of the pulse light intensity such as would vary with a temperature change and temporal drift etc., a light intensity noise extraction circuit for extracting light intensity noise from an output signal of the photodetector to extract an AC component of the pulse light intensity such as would vary with a ripple that changes at high speed, and a current modulator circuit for modulating a current on the basis of output signals from the light intensity signal comparator circuit and the light intensity noise extraction circuit.

Further, in the same pulsed light source, said electric pulse generator comprises a stabilized electric pulse generator for amplitude modulator a pulse signal in accordance with an output signal from the photodetector, and the stabilized. electric pulse generator comprises a light intensity signal comparator circuit for comparing a signal from the photodetector representative of a level signal to make a signal with a DC of the pulse light intensity such as would vary with a temperature change and temporal drift, etc., a light intensity noise extraction circuit for extracting an AC component of the pulse light intensity that changes at high speed, such as would vary with ripples, etc., and an amplitude modulator circuit for modulating the amplitude of an output pulse voltage on the basis of output signals from the just-mentioned circuits.

Further, in the same pulsed light source, said control means modulates the bias current of the current source according to an output of the current modulator representative of pulse light intensity fluctuations having a frequency in a frequency region below a predetermined frequency and modulates the amplitude of a pulse signal generated from the electric pulse generator according to an output of the amplitude modulator circuit representative of pulse light intensity fluctuations having a frequency in a frequency region above the predetermined frequency, such that the intensity of said pulsed light remains unchanged and light intensity noise is reduced.

Additionally, a step recovery diode is incorporated in said electric pulse generator.

Additionally, said photodetector is assembled in the same package together with a laser diode.

Additionally, the time constant of a feedback system which detects the pulsed light and controls the same is longer than the repetitive period of the pulsed light.

Additionally, the frequency characteristics of the feedback system has a peak to reduce light intensity noise in a specific frequency region, and the frequency of a reference signal of a lock-in amplifier for use in a measuring system is within said specific frequency region.

Further, to achieve the above object a nondestructive E-O sampling apparatus according to the present invention comprises a low noise pulsed light source using a laser diode including a laser diode for emitting repetitive pulsed light, an electric pulse generator for driving the laser diode, a current source for supplying a bias current to the laser diode, a photodetector for detecting the repetitive pulsed light emitted from the laser diode, and a control means for modulating at least the bias current from the current source and the amplitude of a pulse signal generated from the electric pulse generator in accordance with an output signal from the photodetector such that the intensity of the pulsed light is kept unchanged; and an optical probe disposed near an object to be measured, wherein the optical probe includes an electrooptic crystal and is adapted to modulate the light pulse for sampling by making use of a change in the refractive index of the electrooptic crystal caused by an electric field induced on the surface of the object by a current flowing through the same.

FIG. 1 illustrates an example of the basic construction of the present invention.

A laser diode (LD) 38 is first brought to pulsed oscillation by previously supplying a bias current thereto and applying a short pulse electric signal thereto from an electric pulse generator 40 through a capacitor $C_1$. A photodetector 42 such as a photodiode (PD) detects splitted light of the LD light or light emanating from the other end of the LD 38. An output from the photodetector 42, which is proportional to the intensity of the LD light is amplified and is used to permit a stabilized current modulator circuit 44 to modulate the bias current of the LD 38 and control the bias current such that the intensity of the LD light remains unchanged.

Herein, the time constant of the feedback system is set to be sufficiently longer than the repetitive period of the LD pulsed light. Thereby, the intensity of the LD pulsed light is automatically controlled to remain unchanged, and light intensity noise is also reduced as indicated by the broken line B and the marks Δ in FIG. 12.

As shown in FIG. 2, the foregoing stabilized current modulator circuit 44 comprises, a light intensity signal comparator circuit 44A for comparing the output from the photodetector 42 and a level signal, and making a signal representative of a constant DC component of the pulse light intensity such as would vary with a temperature change and temporal drift etc., a light intensity noise extraction circuit 44B for extracting light intensity noise from an output signal of the photodetector 42 to extract an AC component of the pulse light intensity such as would vary with a ripple that changes at high speed, and a current modulator circuit 44C for modulating a current on the basis of output signals from the light intensity signal comparator circuit 44A and the light intensity noise extraction circuit 44B.

Herein, although in the basic construction illustrated in FIG. 1 the bias current supplied to the LD 38 was modulated by the stabilized current modulator circuit 44 over a wide frequency range in accordance with an output signal from the photodetector 42, the construction to make constant the intensity of the LD pulsed light is not limited thereto. For example, the electric pulse generator 40 may be replaced by the stabilized electric pulse generator 41 as illustrated in FIG. 3, and the amplitude of a pulse signal generated by the stabilized electric pulse generator 41 may be modulated in accordance with an output signal from the photodetector 42 via a photoelectric current amplifier 54. Additionally, both may be combined such that the bias current is modulated by the stabilized current modulator circuit 44 according to light intensity fluctuations having a frequency in a frequency region below a predetermined frequency while the amplitude of a pulse signal generated by the stabilized electric pulse generator 41 is modulated according to light intensity fluctuations having a frequency in a frequency range above the predetermined frequency.

With such construction, it is possible to stabilize the intensity of high repetition pulsed light and reduce the light intensity noise. A light pulse generated by such an LD is therefore usable in a variety of measuring fields such as for example E - O sampling, fluorescence lifetime measurement, photoelectric detection, estimation of response characteristics of OE ICs and the like, and temporal correlation photon counting, for the purpose of the improvement of the accuracy of those measurements and of the extension of the lower limits of the sensitivity of the measurements.

BRIEF DESCRIPTION OF THE DRAWINGS

The exact nature of this invention, as well as other objects and advantages thereof will be readily apparent from consideration of the following specification relating to the accompanying drawings, in which like reference characters designate the same or similar parts throughout the figures thereof and wherein.

DESCRIPTION OF THE PREFERRED EMBODIMENT

In what follows, embodiments of the present invention will be described with reference to the accompanying drawings.

Figure 1:
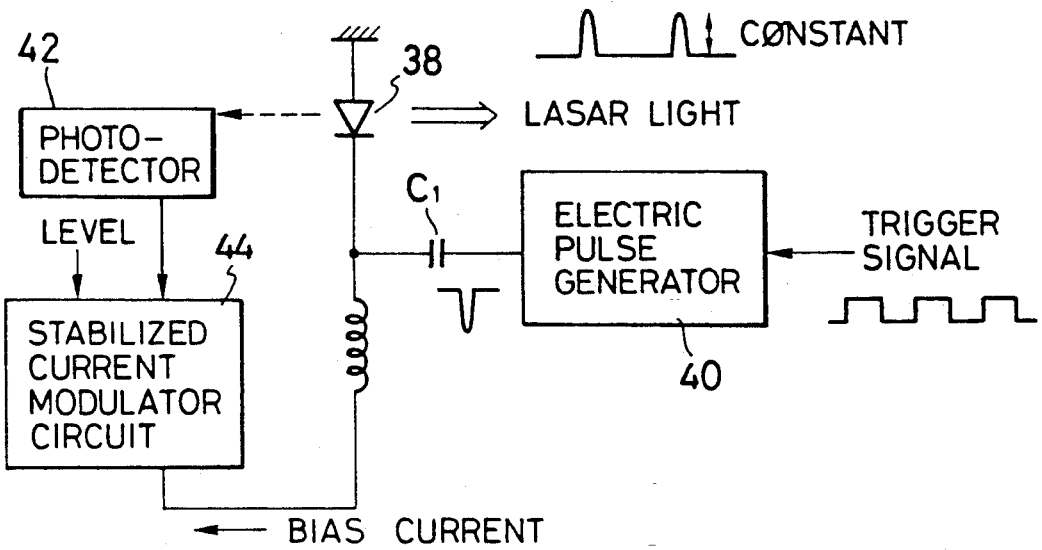
FIG. 1 is a block diagram exemplarily illustrating the basic construction of a low noise pulsed light source using a laser diode (LD) according to the present invention.
Figure 2:
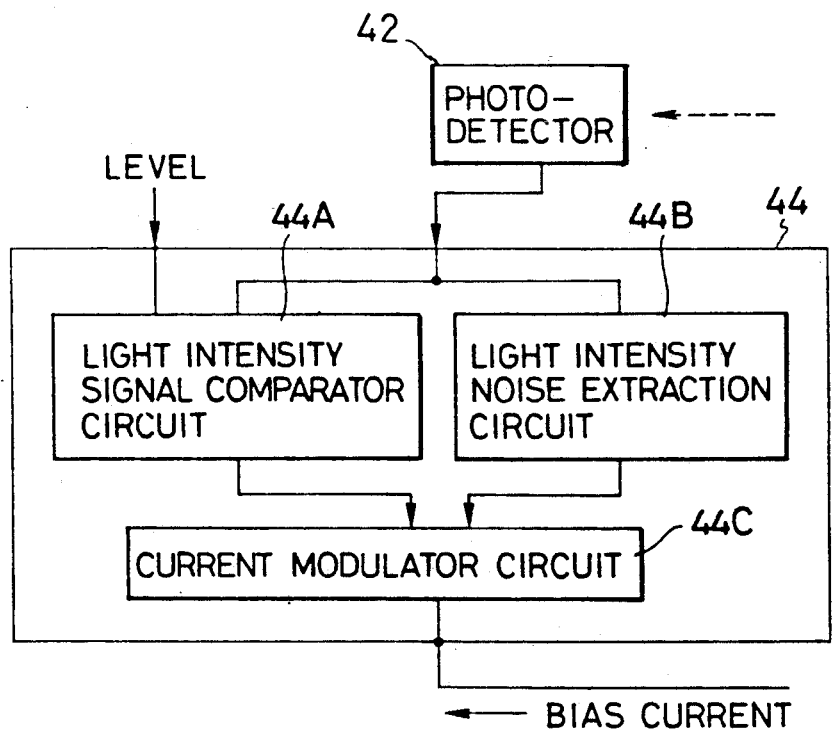
FIG. 2 is a block diagram illustrating a stabilized current modulator circuit in the above basic construction.
Figure 3:
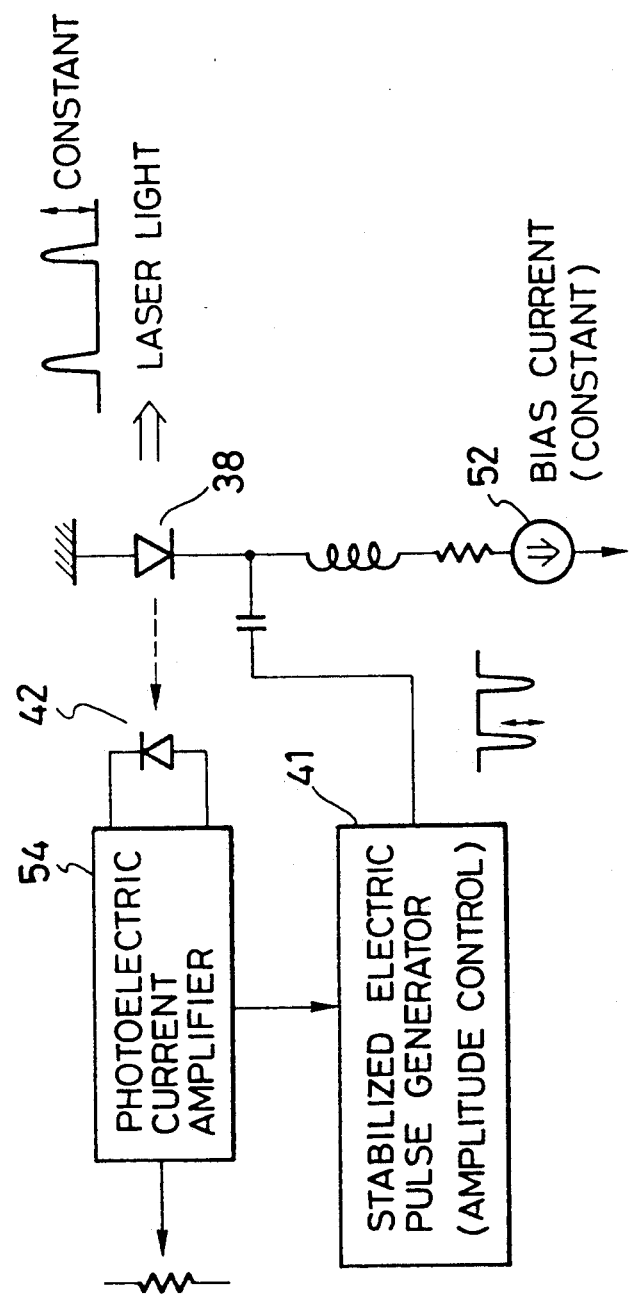
FIG. 3 is a block diagram illustrating another basic construction of a low noise pulsed light source according to the present invention.
Figure 4:
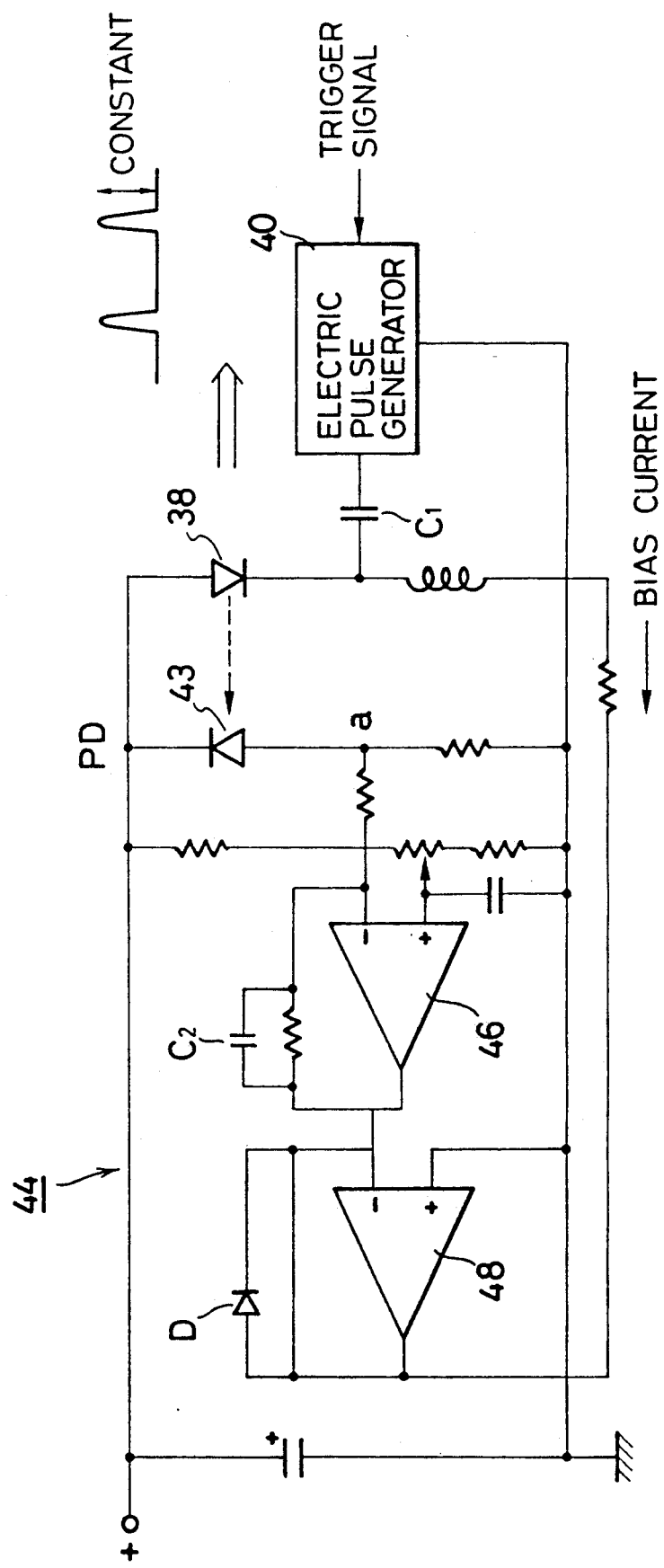
FIG. 4 is a circuit diagram illustrating the construction of a first embodiment of the present invention.

A first embodiment of the present invention embodies the basic construction illustrated in FIG. 1 and principally comprises, as illustrated in FIG. 4, a reverse-biased pin photodiode (PIN - PD) 43 for detecting part of emitted light from the LD 38, and a current modulator circuit 44 composed of a first amplifier 46 for inversely amplifying a photoelectric current signal yielded by the PIN - PD 43 to alter the DC level of an output signal and of a second amplifier 48 as an inverted current amplifier for inverting and amplifying the output of the first amplifier 46.

The first amplifier 46 has a feedback loop that incorporates a capacitor $C_2$ for making the time constant of the first amplifier 46 longer than the repetitive period of the pulsed light.

Additionally, the second amplifier 48 has a feedback loop that incorporates a diode D to prevent an opposite bias current from flowing.

Other features are identical to those in the basic construction illustrated in FIG. 1 and the description thereof will be omitted.

Operation of the first embodiment is as follows.

As the intensity of pulsed light from the LD 38 is increased, for example, a photoelectric current from the PIN - PD 43 is increased to raise the potential at the point a in the figure. Thereby, the output voltage of the first amplifier 46 is decreased, and hence the output current of the second amplifier 48 (the direction of the arrow in the figure is assumed to be positive) or the bias current is decreased. Therefore, the intensity of the output light from the LD 38 is reduced and controlled such that it remains unchanged.

Figure 5:
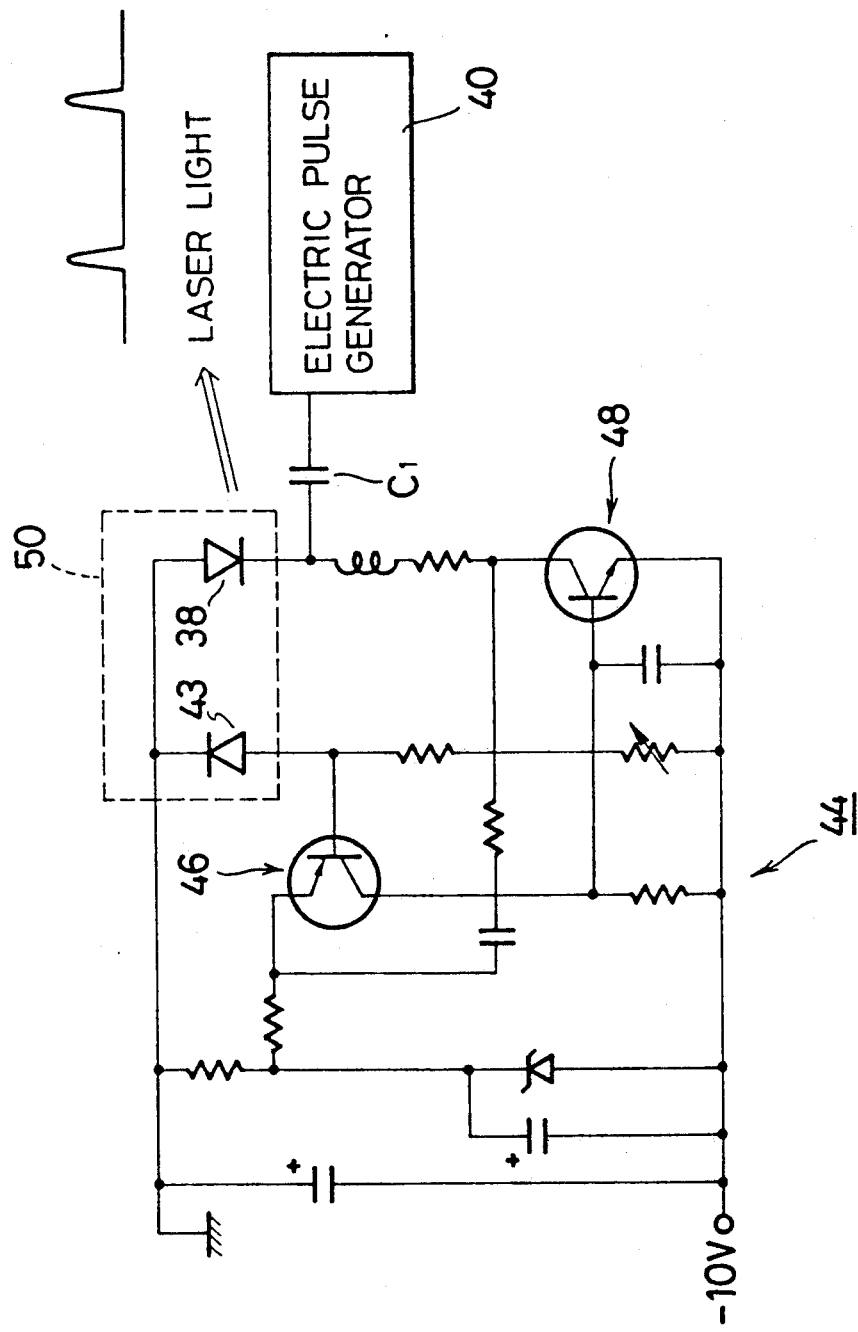
FIG. 5 is a circuit block diagram exemplarily illustrating the concrete construction of the first embodiment of the present invention.

Referring to FIG. 5, the concrete construction of the first embodiment is exemplarily illustrated. In the present example, the amplifiers 46, 48 comprise transistors, capacitors, and resistors, etc., respectively. Further, a set of the LD 38 and the PIN - PD 38 is housed in the same package 50, for miniaturization thereof.

Figure 6:
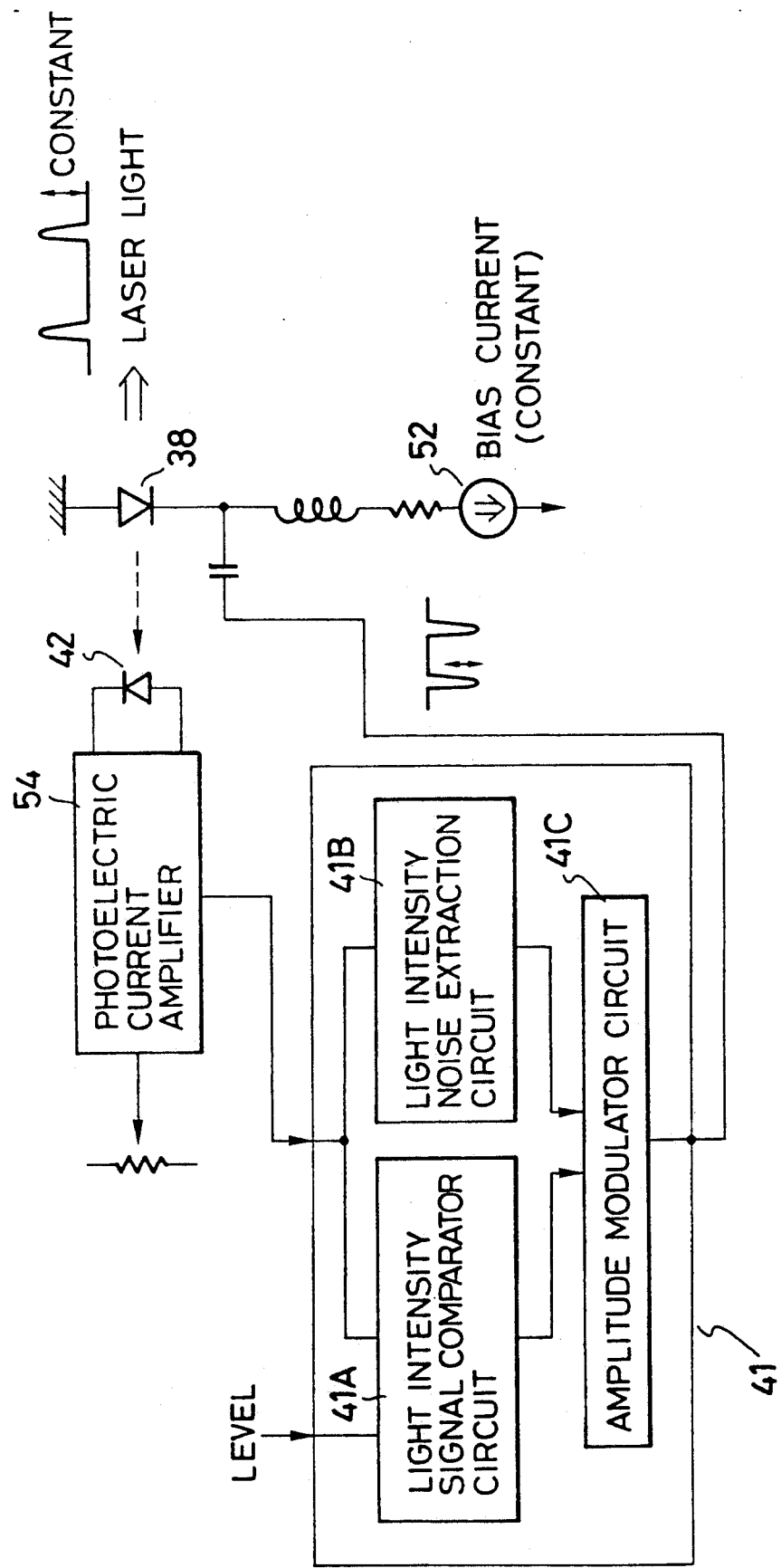
FIG. 6 is a block diagram illustrating the construction of a second embodiment of the present invention.

In succession, a second embodiment of the present invention will be described with reference to FIG. 6.

In the second embodiment, a direct current (DC) bias current supplied from a current source 52 to the LD 38 is made constant, while a signal detected by the photodetector 42 is amplified by the photoelectric current amplifier 54 and adapted to modulate the amplitude of a pulse voltage applied from the stabilized electric pulse generator 41, that is controllable in amplitude over a wide frequency range, to the LD 38.

The stabilized electric pulse generator 41 comprises a light intensity signal comparator circuit 41A for comparing a signal from the amplifier 54 with a level signal to make a signal representative. DC component of the pulse light intensity such as would vary with a temperature change and temporal drift, etc., a light intensity noise extraction circuit 41B for extracting an AC component of the pulse light intensity that changes at high speed, such as would vary with ripples, etc., and an amplitude modulator circuit 41C for modulating the amplitude of an output pulse voltage on the basis of output signals from the just-mentioned circuits.

It will be appreciated by persons of ordinary skill in the art that light intensity comparator circuit 41A is further comprised of a low pass filter while light intensity noise extraction circuit 41B is further comprised of a high pass filter.

More specifically, when the intensity of the LD pulsed light is strong, the amplitude of the pulsed voltage is controlled such that the amplitude is reduced. Thereby, the intensity of the LD pulsed light is kept unchanged and pulse light intensity noise is reduced.

Figure 7:
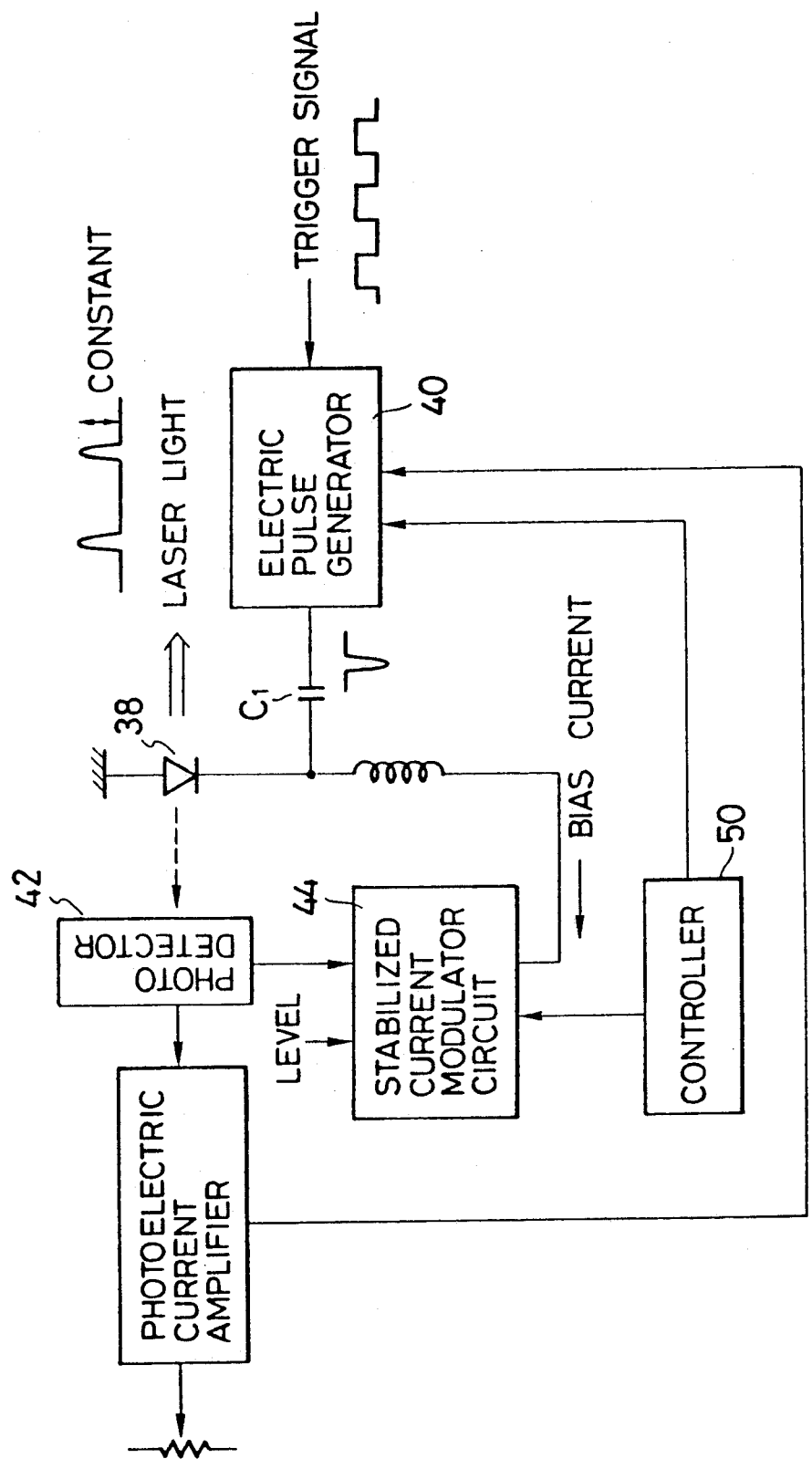
FIG. 7 is a block diagram illustrating the construction of a third embodiment of the present invention.

Herein, although in the first and second embodiments any one of the amplitudes of the DC bias current and the pulse voltage was modulated, both may be done simultaneously, as disclosed in a third embodiment illustrated in FIG. 7. In the third embodiment, a controller 50 separates the modulation frequency regions of the two modulation systems. For example, a frequency range of from DC to 1 kHz may be controlled by the DC bias current while a frequency range above 1 kHz may be controlled by the amplitude of the pulse voltage.

Successively, a fourth embodiment of the present invention will be described.

Figure 8:
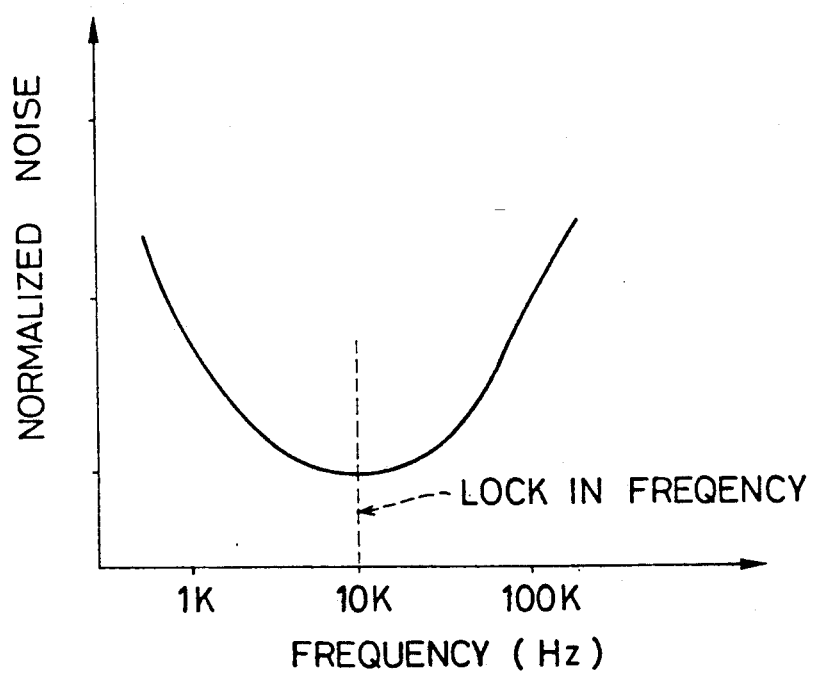
FIG. 8 is a diagram illustrating the principle of a fourth embodiment of the present invention.

In the fourth embodiment, frequency characteristics are provided to the feedback system (optical detection→ amplification→ control) described in the first and second embodiments, and with frequency characteristics so obtained and illustrated in normalized noise in FIG. 8, a lock-in amplifier in a measuring system is locked at a frequency where less noise is involved.

Figure 9:
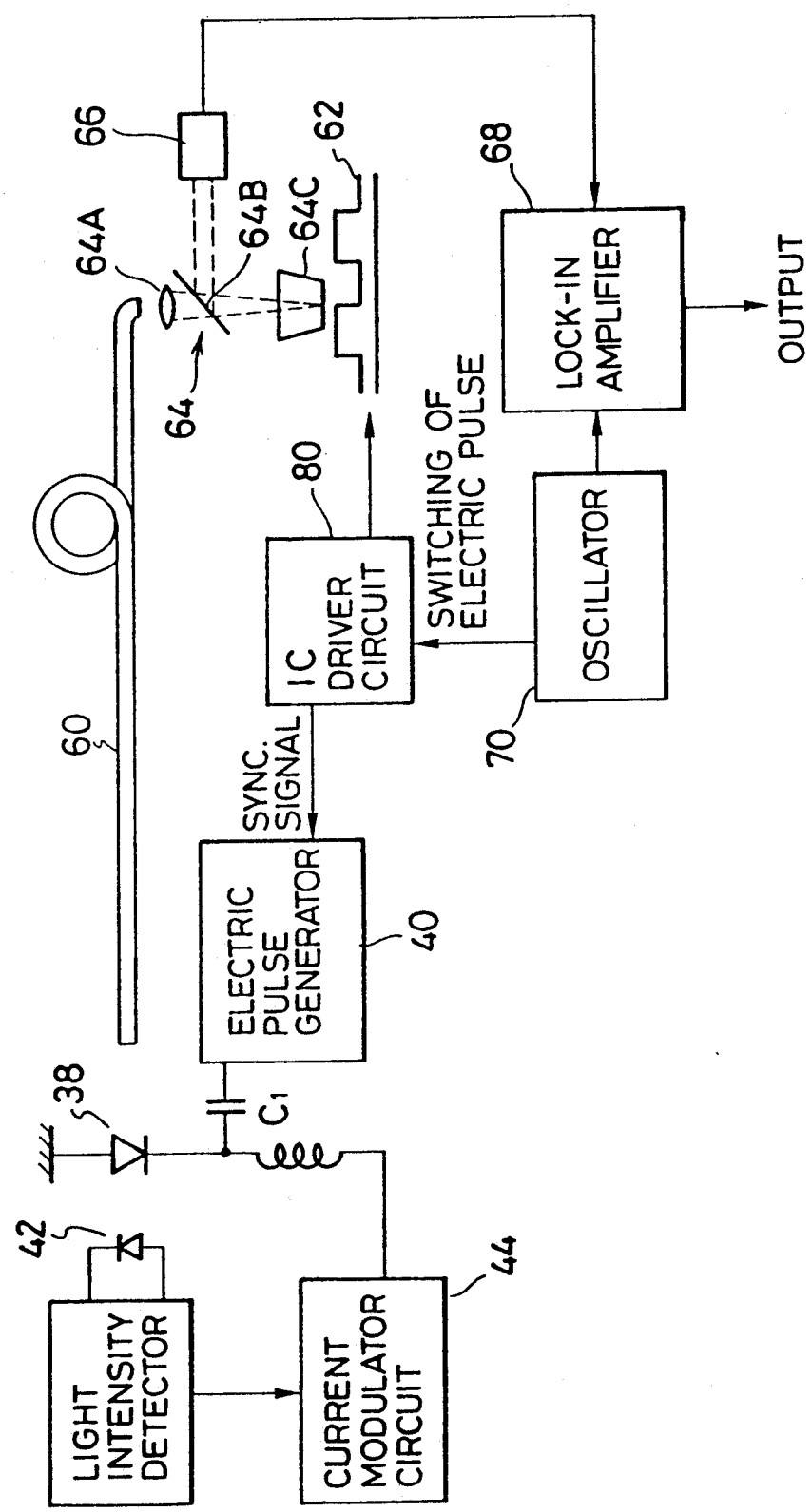
FIG. 9 is a block diagram exemplarily illustrating the construction of an E - O sampling device with use of the fourth embodiment.
Figure 10:
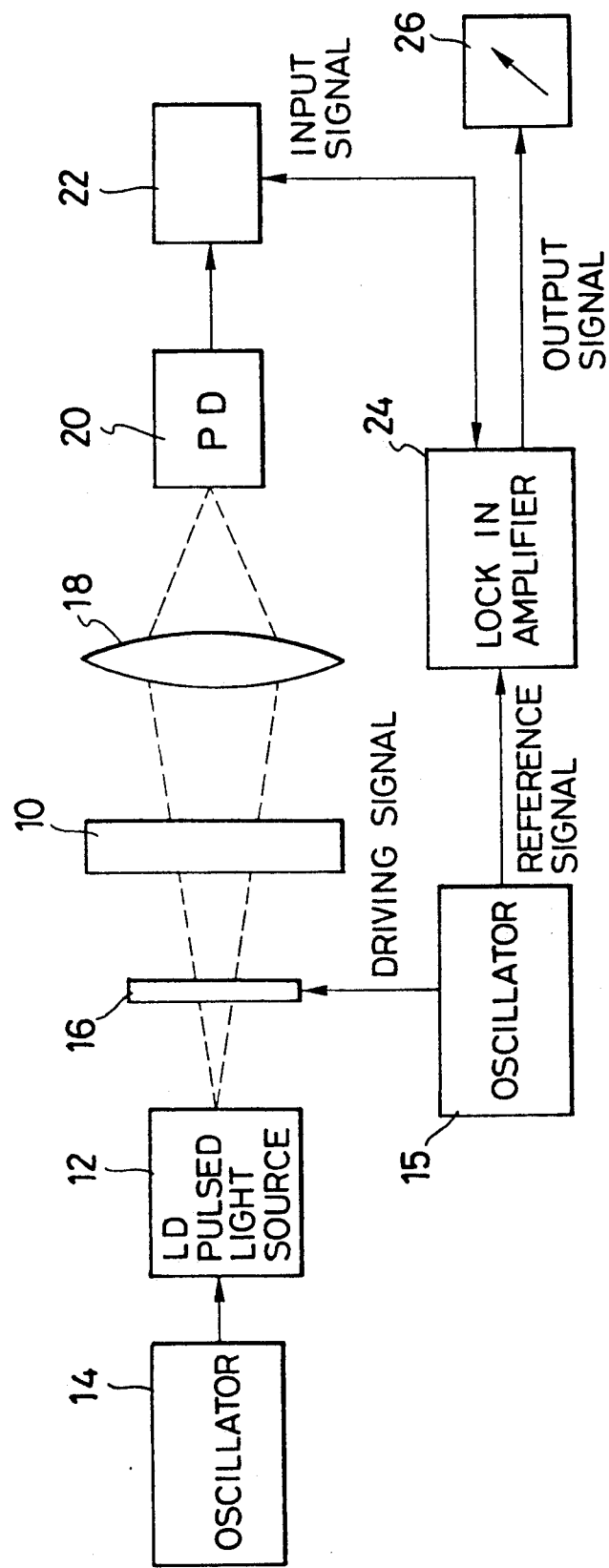
FIG. 10 is a block diagram exemplarily illustrating the construction of a transmittance measuring device intended to describe the difficulties of the prior art.
Figure 11:
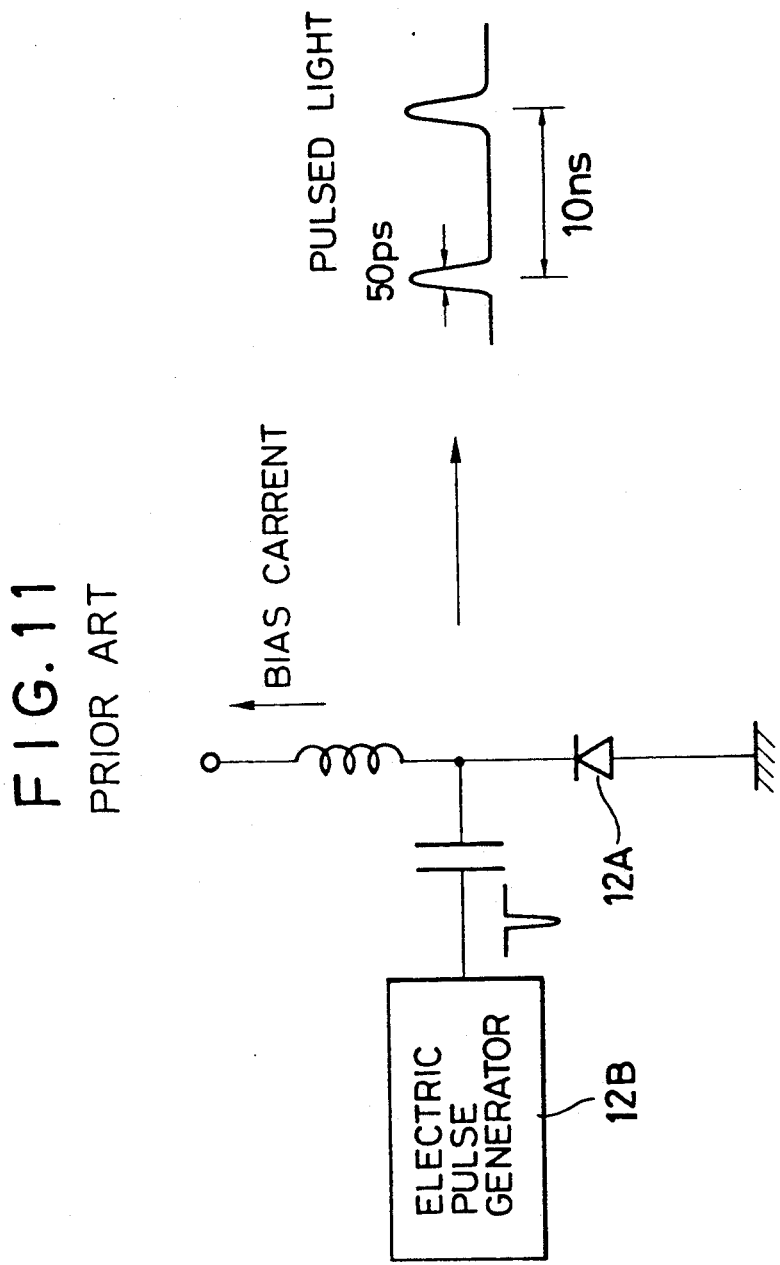
FIG. 11 is a block diagram exemplarily illustrating the construction of an LD pulsed light source used in the device of FIG. 10.
Figure 12:
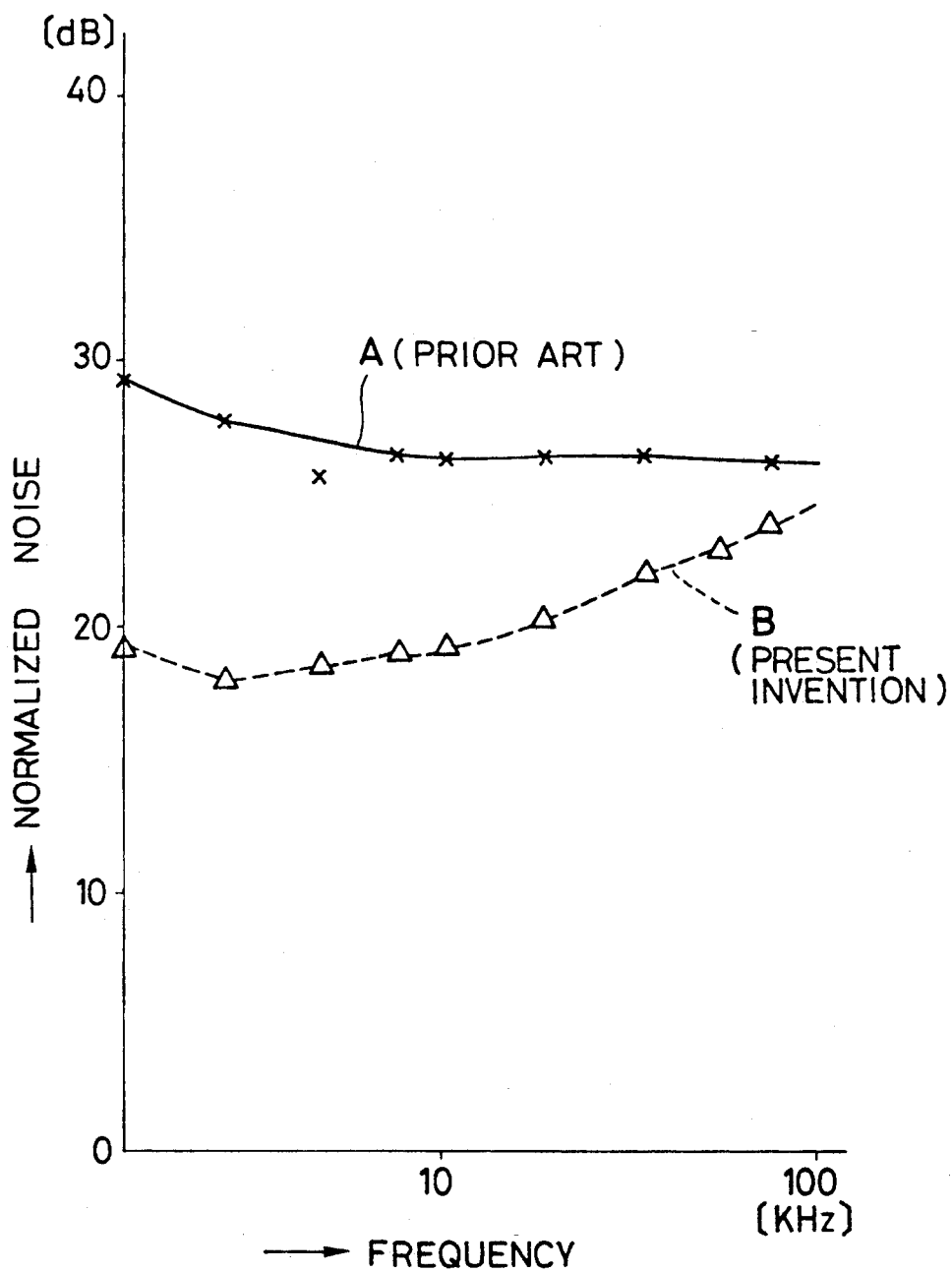
FIG. 12 is a diagram illustrating the comparison between frequency characteristics of noise levels of LD pulsed lights in the prior art and the embodiment of the present invention.
Figure 13:
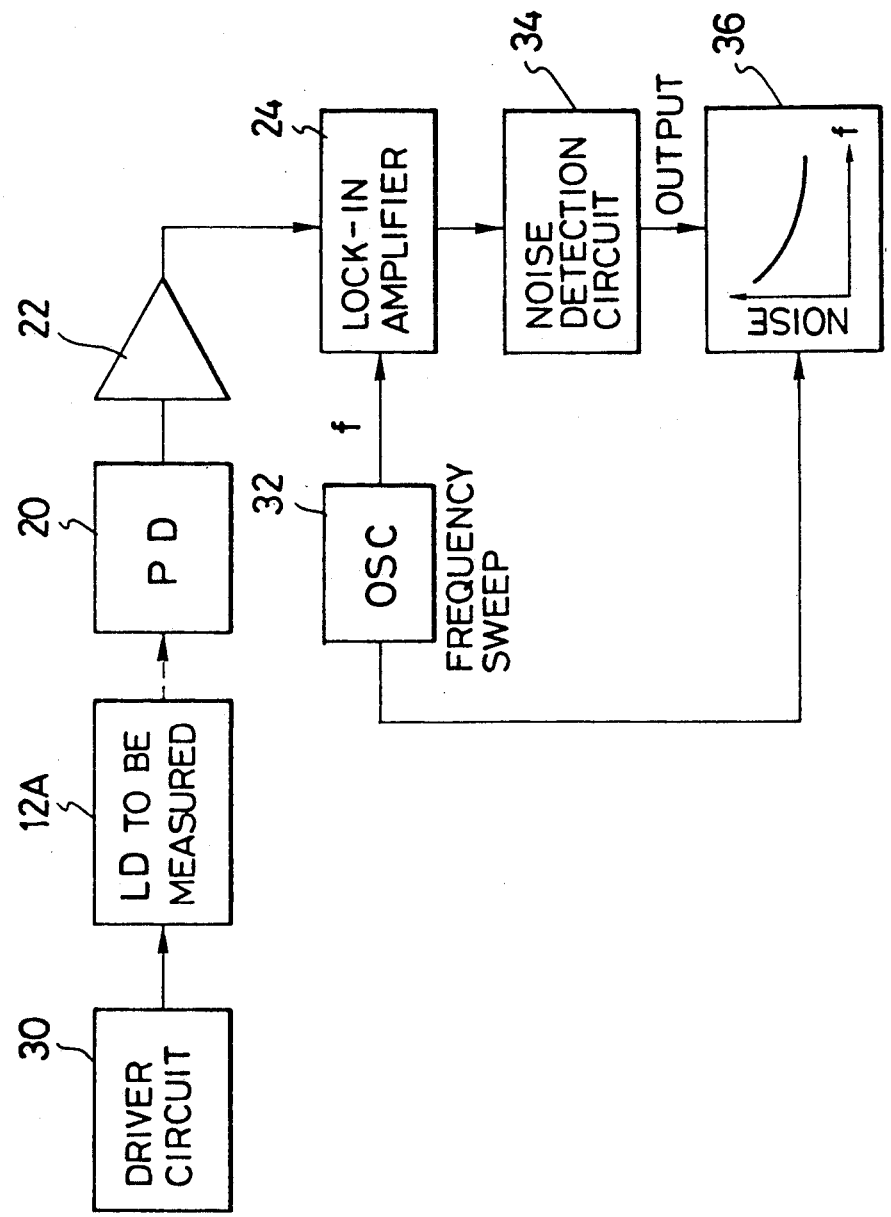
FIG. 13 is a block diagram exemplarily illustrating a noise component measuring device used for obtaining the data in FIG. 12.

To be concrete, FIG. 9 exemplarily illustrates the construction of the fourth embodiment applied to nondestructive E - O sampling. In this construction example, laser light emitted from the LD 38 (pulsed light for sampling) is fed to an optical probe 64 disposed upwardly of an IC 62 to be measured through an optical fiber 60 for example. The optical probe 64 comprises a lens 64A, a half mirror 64B and an electrooptic crystal 64C, and is adapted to modulate the pulsed light for sampling by making use of a change in the refractive index of the electrooptic crystal 64C caused by an electric field induced on the surface of the IC 62 by a current flowing through the same. The pulsed light modulated by the change in the refractive index is detected by the photodetector 66 and outputted through the lock-in amplifier 68. The lock-in amplifier 68 and an IC driver circuit 80, which switches an electric circuit on and off at a lock-in frequency and puts out a synchronizing signal to the electric pulse generator 40, are controlled by an output from an oscillator 70 for switching an electric pulse on and off.

Such construction assures noise reduction. Additionally, although it is generally difficult to assure low noise detection over a wide frequency range, it is possible to realize low noise detection of the whole measuring system by reducing light intensity noise at a specific frequency.

Herein, although the foregoing embodiments of the present invention were applied to the E-O sampling, the scope of the present invention is not limited thereto, and may clearly be applied also to fluorescence lifetime measurement for measuring laser-excited fluorescence, estimation of response characteristics of a photoelectric detector and an OE IC, etc., and time correlated photon counting method using a photomultiplier, and so on.

What is claimed is:

1. A nondestructive E-O sampling apparatus comprising:
   a low noise pulsed light source including a laser diode for emitting repetitive pulsed light, an electric pulse generator for driving the laser diode, a current source for supplying a bias current to the laser diode, a photodetector for detecting the repetitive pulsed light emitted from the laser diode, wherein at least one of the bias current from the current source and an amplitude of a pulse signal generated from the electric pulse generator is modulated according to an output signal from the photodetector such that an intensity of the pulsed light is kept unchanged; and
   an optical probe disposed in a beam path between said laser diode and an object to be measured, wherein the optical probe includes an electrooptic crystal and is adapted to modulate the light pulse for sampling by making use of a change in the refractive index of the electrooptic crystal caused by an electric field induced on the surface of the object by a current flowing through the same.

2. The nondestructive E-O sampling apparatus of claim wherein said current source comprises a stabilized current modulator circuit for modulating said bias current according to an output signal of said photodetector, said stabilized current modulator circuit comprising:
   a light intensity signal comparator circuit for comparing said output signal to a level signal and producing a first signal indicative of a DC component of said pulsed light intensity;
   a light intensity noise extraction circuit for extracting light intensity noise from said output signal and producing a second signal indicative of an AC component of said pulsed light intensity; and
   a current modulator circuit for modulating said bias current according to said first and second signals.

3. The nondestructive E-O sampling apparatus of claim 1, wherein said electric pulse generator comprises a stabilized electric pulse generator for modulating said pulse signal amplitude according to an output signal of said photodetector.

4. The nondestructive E-O sampling apparatus of claim 3, wherein said stabilized electric pulse generator comprises:
- a light intensity signal comparator circuit for comparing said output signal to a level and producing a first signal indicative of a DC component of said pulsed light intensity;
- a light intensity noise extraction circuit for extracting light intensity noise from said output signal and producing a second signal indicative of an AC component of said pulsed light intensity; and
- an amplitude modulator circuit for modulating said pulsed signal amplitude according to said first and second signals.

5. The nondestructive E-O sampling apparatus of claim 1, wherein:
said current source comprises a stabilized current modulator circuit including
- a light intensity signal comparator circuit for comparing an output signal of said photodetector to a level signal and producing a first signal indicative of a DC component of said pulsed light intensity, and
- a current modulator circuit for modulating said bias current according to said first signal; and said electric pulse generator comprise a stabilized electric pulse generator including
- a light intensity noise extraction circuit for extracting light intensity noise from said output signal and producing a second signal indicative of an AC component of said pulsed light intensity, and
- an amplitude modulator circuit for modulating said pulse light amplitude according to said second signal.

6. The nondestructive E-O sampling apparatus of claim 1, wherein said electric pulse generator comprises a generator using a step recovery diode.

7. The nondestructive E-O sampling apparatus of claim 1, wherein said photodetector is assembled as a set with said laser diode into the same package.

8. The nondestructive E-O sampling apparatus of claim 1, wherein:
said at least one of said electric pulse generator and said current source forms a portion of a feedback system for modulating a least one of the bias current and the pulse signal amplitude according to the detected repetitive pulse light; and
a time constant of said feedback system is longer than a repetition period of the repetitive pulse light.

9. The nondestructive E-O sampling apparatus of claim 8, wherein said feedback system is characterized by a frequency response graph having a peak in a predetermined frequency range corresponding to a modulation frequency of said electrooptic crystal.

* * * * *